United States Patent
Ishii

(10) Patent No.: US 6,653,729 B2
(45) Date of Patent: Nov. 25, 2003

(54) SEMICONDUCTOR DEVICE AND TEST METHOD FOR MANUFACTURING SAME

(75) Inventor: Junya Ishii, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 37 days.

(21) Appl. No.: 09/960,380

(22) Filed: Sep. 24, 2001

(65) Prior Publication Data

US 2002/0039801 A1 Apr. 4, 2002

(30) Foreign Application Priority Data

Sep. 29, 2000 (JP) ........................................ 2000-300281

(51) Int. Cl.[7] ........................ H01L 23/052; H01L 23/53; H01L 29/40
(52) U.S. Cl. .................... 257/700; 257/775; 438/612
(58) Field of Search ............................ 257/750–758, 257/781, 789, 775–780, 690–700; 438/612, 655, 656, 10–18

(56) References Cited

U.S. PATENT DOCUMENTS 6,163,074 A * 12/2000 Lee et al. .................... 257/734
6,339,257 B1 * 1/2002 Fujiki et al. ................. 257/751
6,365,970 B1 * 4/2002 Tsai et al. .................... 257/751

FOREIGN PATENT DOCUMENTS

| | | |
|---|---|---|
| JP | 04-254342 | 9/1992 |
| JP | 5-109813 | 4/1993 |
| JP | 5-183007 | 7/1993 |
| JP | 6-196525 | 7/1994 |
| JP | 06-283611 | 10/1994 |
| JP | 8-213422 | 8/1996 |
| JP | 10-064945 | 3/1998 |
| JP | 11-121458 | 4/1999 |
| JP | 2000-195866 | 7/2000 |
| JP | 2001-308139 | 11/2001 |
| JP | 2001-358169 | 12/2001 |

OTHER PUBLICATIONS

Japanese Office Action dated Jan. 28, 2003 with partial English translation.

* cited by examiner

Primary Examiner—Caridad Everhart
Assistant Examiner—Calvin Lee
(74) Attorney, Agent, or Firm—McGinn & Gibb, PLLC

(57) ABSTRACT

A test method for a semiconductor device in which a bonding pad thereof comprises a first interconnect layer and a second interconnect layer, the bonding pad comprising: a plurality of connection parts, provided within a plurality of slit-shaped trenches formed in an interlayer insulation film, respectively, and connecting the first interconnect layer and the second interconnect layer, the connection parts being disposed in one direction with a prescribed spacing, wherein the method comprising; contacting a test probe for testing the semiconductor device with the bonding pads so as to be in a direction parallel to a longitudinal direction of the connection part.

8 Claims, 4 Drawing Sheets

PROBE:3  2:BONDING PAD  1:CONNECTION PART  15':TRENCH

16:INTERLAYER INSULATION FILM
3:PROBE
18:PASSIVATION FILM
17:UPPER-LAYER METAL PAD
15:CONNECTION PART
14:LOWER-LAYER METAL PAD
13:INTERLAYER INSULATION FILM
12:FIELD OXIDE FILM
11:SEMICONDUCTOR SUBSTRATE

Fig. 3

| | NUMBER OF CONTACTINGS | | | OVERDRIVE AMOUNT (GRAMS) |
| --- | --- | --- | --- | --- |
| | 4 | 10 | 20 | |
| CONVENTIONAL STRUCTURE 1 (Fig. 7) | × | — | — | 100 |
| | × | × | — | 80 |
| | ○ | × | — | 60 |
| | ○ | × | — | 50 |
| CONVENTIONAL STRUCTURE 2 (SLIT DIRECTION IS ROTATED 90° WITH RESPECT TO FIRST EMBODIMENT (Fig. 1)) | — | — | — | 100 |
| | — | — | — | 80 |
| | × | — | — | 60 |
| | × | × | — | 50 |
| FIRST EMBODIMENT (Fig. 1) | ○ | × | — | 100 |
| | ○ | × | × | 80 |
| | ○ | ○ | ○ | 60 |
| | ○ | ○ | ○ | 50 |
| THIRD EMBODIMENT (Fig. 5) | × | — | — | 100 |
| | × | × | — | 80 |
| | ○ | ○ | ○ | 60 |
| | ○ | ○ | ○ | 50 |

○ NO CRACKS
× CRACKS OCCURRED

Fig. 4

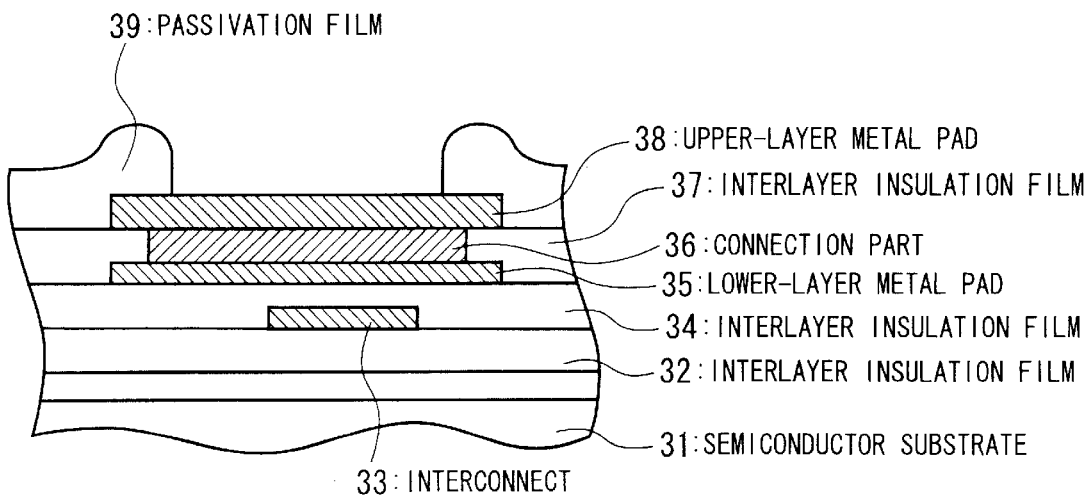

39: PASSIVATION FILM
38: UPPER-LAYER METAL PAD
37: INTERLAYER INSULATION FILM
36: CONNECTION PART
35: LOWER-LAYER METAL PAD
34: INTERLAYER INSULATION FILM
32: INTERLAYER INSULATION FILM
31: SEMICONDUCTOR SUBSTRATE
33: INTERCONNECT

42: BONDING PAD

161: BRIDGE CONNECTING PART

CONNECTION PART: 151

61: VIA HOLE  62: BONDING PAD

SEMICONDUCTOR DEVICE AND TEST METHOD FOR MANUFACTURING SAME

BACKGROUND OF THE INVENTION

1. Field of the Invention

The present invention relates to a semiconductor device and a test method for manufacturing a semiconductor device, and more particularly to a semiconductor device and test method for manufacturing a semiconductor device which prevent both cracking and peeling of a bonding pad at the time of probing during a chip test.

2. Related Art

In the past, there has been the problem of peeling between a bonding pad and an interlayer insulation film, leading to a reduction in assembly yield.

In order to solve this type of problem, a semiconductor device as shown in FIG. 7 of the accompanying drawings is proposed. The bonding pad of this semiconductor device comprises a plurality of metal interconnect layers and a large number of via holes 61 filled with conductive materials, and a plurality of metal interconnect layers are connected by a large number of holes 61, so as to prevent peeling between the bonding pad 62 and the interlayer insulation film. In the method, however, because of the design restriction of the hole-to-hole spacing, there is a limit to the surface area of holes used to make connection between metal pads. In particular, with an increase in the number of functions built into a chip, the number of pins used to access signal lines increases, this leading to a decrease in the bonding pad surface area. If the bonding pad surface area becomes small, there is an increase in the shock imparted to the bonding pad. Additionally, to prevent an increase of the delay time by interconnects, in the case in which a fluorine-doped silicon oxide film (FSG) is used as a low-dielectric-constant interlayer insulation film, a reaction occurs between the fluorine and the barrier metal, this facilitating peeling at the boundary between the pad and the interlayer insulation film.

For this reason, in the unexamined Japanese patent publication (KOKAI) No.6-196525 there is disclosure of a bonding pad using a plurality of slits filled with conductive materials for connection between an upper metal layer and a lower metal layer, so as to enhance the wire pulling strength at the time of bonding.

Because the above-noted technology makes use of a slits to make connections between an upper metal layer and a lower metal layer, the slit surface area making connection between an upper metal layer and a lower metal layer is larger compared to the case of using holes, so that the strength of the connection made between metal layers is improved, this being somewhat effective in preventing bonding pad peeling.

In the above-noted technology, however, in the case in which when performing a chip test before performing wire bonding, if the intrusion direction of the probe is perpendicular to the direction of the slit, there are cases in which cracks occur between the side walls of the slit and the interlayer insulation film. In such cases, when performing bonding of the assembly, because a crack has already occurred, there is a tendency toward pad peeling.

Additionally, in the case of a structure in which an interconnect is provided beneath a bonding pad, if a crack formed at the time of chip testing reaches the interconnect provided beneath a bonding pad, because there is an area which is not surrounded with an interlayer film around the interconnect, there is a deterioration of immunity to migration in this part of the interconnect. In the case in which water intrudes from the crack part, there was the problem of corrosion of the interconnect, with the possibility of an open connection in the interconnect.

Accordingly, it is an object of the present invention to improve on the above-noted drawbacks in the prior art, by providing a novel semiconductor device and test method for manufacturing a semiconductor device, which prevent cracking and peeling of a bonding pad and prevent open connections caused by corrosion.

SUMMARY OF THE INVENTION

To achieve the above-noted objects, the present invention adopts the following basic technical constitution.

Specifically, the first aspect of the present invention is a semiconductor device in which a bonding pad thereof comprises a first interconnect layer and a second interconnect layer, the bonding pad comprising: a plurality of slit-shaped trenches arranged parallel to each other and formed within an interlayer insulation film provided between the first and second interconnect layers, a first connection part 151 provided within one of the slit-shaped trenches and connecting the first interconnect layer and the second interconnect layer, a second connection part 152 and a third connection part 153 provided within other slit-shaped trenches and connecting the first interconnect layer and the second interconnect layer, respectively, the second connection part 152 and the third connection part 153 being disposed so as to sandwich the first connection part 151 with a prescribed spacing B, a first bridge connecting part 161 and a second bridge connecting part 162, formed in the interlayer insulation film, connecting the first connection part 151 and the second connection part 152, and a third bridge connecting part 163, formed in the interlayer insulation film, connecting the first connection part 151 and the third connection part 153, the third bridge connecting part 163 being disposed between the first bridge connecting part 161 and the second bridge connecting part 162.

In the second aspect of the present invention, a width of a connecting portion of the connection part making connection to the bridge connecting part is narrower than that of the connection part.

In the third aspect of the present invention, a width of a connecting portion of the bridge connecting part making connection to the connection part is narrower than that of the bridge connecting part.

The fourth aspect of the present invention is a test method for a semiconductor device in which a bonding pad thereof comprises a first interconnect layer and a second interconnect layer, the bonding pad comprising; a plurality of slit-shaped trenches arranged parallel to each other and formed within an interlayer insulation film provided between the first and second interconnect layers, a first connection part provided within one of the slit-shaped trenches and connecting the first interconnect layer and the second interconnect layer, a second connection part and a third connection part provided within other slit-shaped trenches and connecting the first interconnect layer and the second interconnect layer, respectively, the second connection part and the third connection part being disposed so as to sandwich the first connection part with a prescribed spacing, a first bridge connecting part and a second bridge connecting part, formed in the interlayer insulation film, connecting the first connection part and the second connection part, and a third bridge connecting part, formed in the interlayer insulation film, connecting the first connection part and the third connection part, the third bridge connecting part being disposed between the first bridge connecting part and the second bridge connecting part, wherein the method comprising; contacting a test probe for testing the semiconductor device with the bonding pads so as to be in a direction parallel to a longitudinal direction of the connection part.

The fifth aspect of the present invention is a test method for a semiconductor device in which a bonding pad 2 thereof comprises a first interconnect layer 14 and a second interconnect layer 17, the bonding pad 2 comprising a plurality of connection parts 15, provided within a plurality of slit-shaped trenches 15' formed in an interlayer insulation film 16, respectively, and connecting the first interconnect layer 14 and the second interconnect layer 17, the connection parts 1 being disposed in one direction with a prescribed spacing, wherein the method comprising; contacting a test probe 3 for testing the semiconductor device with the bonding pads 2 so as to be in a direction H2 parallel to a longitudinal direction Hi of the connection part 1.

FIG. 1 of the accompanying drawings is a plan view of a semiconductor device according to the present invention, and FIG. 2 is a cross-sectional view thereof. As shown in these drawings, the upper-layer metal pad 17 formed by the uppermost interconnected layer and the lower-layer metal pad 14 formed by the lowermost interconnect layer are connected by a connection part 15 provided on the interlayer insulation film 16.

The longitudinal direction of the connection part 15 is disposed so as to be parallel to the direction in which the probe makes contact during a chip test. By adopting this configuration, because the connection part 15 is disposed so as to be parallel to the direction of force from the probe 19 when the probe comes into contact with the metal pad 17 during a chip test, it is difficult for cracks to occur.

Therefore, during a chip test, because it is difficult for cracks to occur in the bonding pad, it is difficult for pad peeling to occur at the time of assembly, thereby improving the assembly yield.

BRIEF DESCRIPTION OF THE DRAWING

FIG. 3 is a table showing the effect of the present invention.

FIG. 4 is a cross-sectional view of a second embodiment of the present invention.

DETAILED DESCRIPTION OF THE PREFERRED EMBODIMENTS

Embodiments of a semiconductor device and a test method for manufacturing a semiconductor device according to the present invention are described in detail below, with references made to relevant accompanying drawings.

First Embodiment

Figure 1:
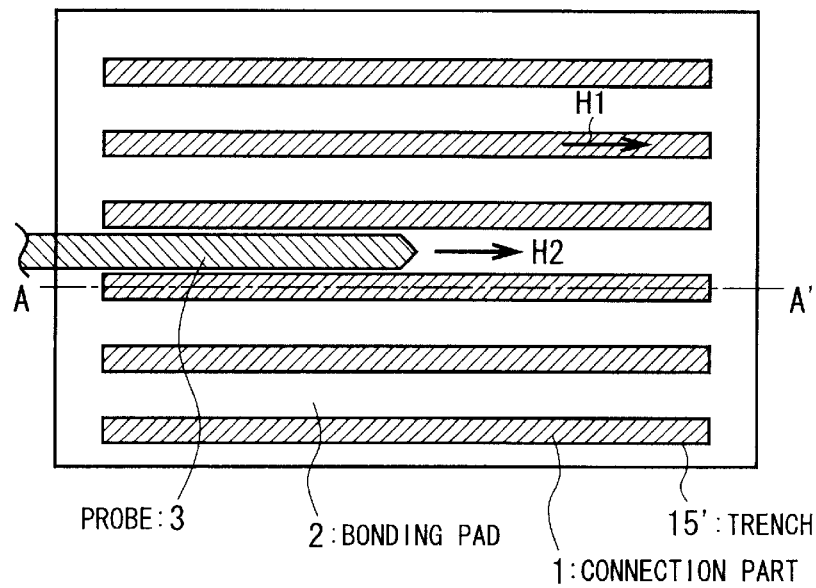
FIG. 1 is a plan view of a semiconductor device according to a first embodiment of the present invention.
Figure 2:
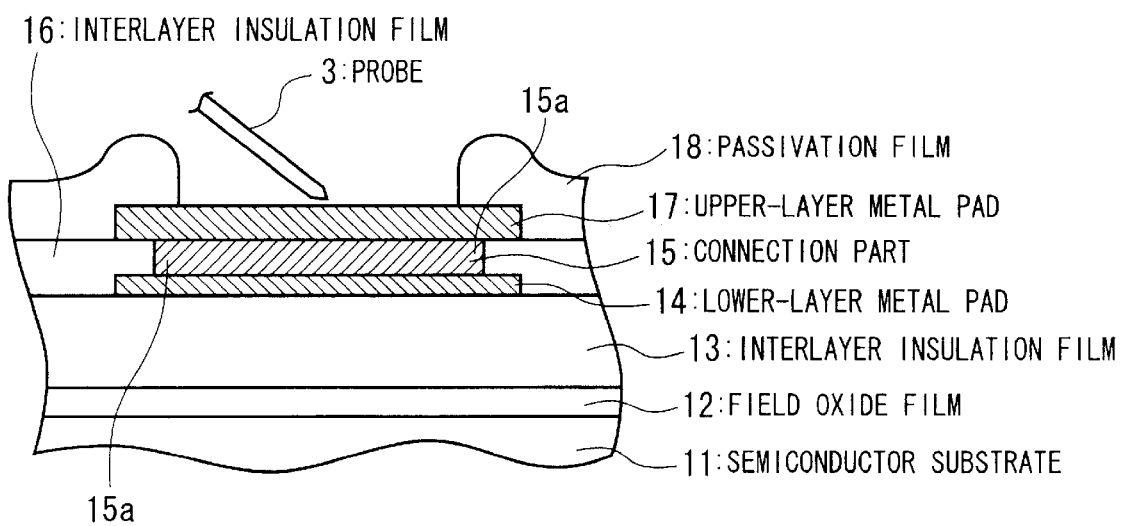
FIG. 2 is a cross-sectional view of the semiconductor device according to the first embodiment of the present invention, seen along the direction indicated by line A–A' in FIG. 1.

FIG. 1 to FIG. 3 show the first embodiment of a manufacturing method according to the present invention, in which a bonding pad 2 is formed by a first interconnect layer 14 and a second interconnect layer 17, wherein a plurality of slit-shaped trenches 15' are formed in an interlayer insulation film 16 provided between the first interconnect layer 14 and the second interconnect layer 17, and further wherein a connection part 15 connecting the first interconnect layer 14 and the second interconnect layer 17 is formed within the trench 15', so that the longitudinal direction H1 of the connection part 15 coincides with the contacting direction H2 of a probe 3 during a chip test.

The first embodiment of the present invention is described in further detail below.

FIG. 1 is a plan view of a bonding pad in a semiconductor device according to the first embodiment of the present invention, and FIG. 2 is a cross-sectional view along the direction indicated as A–A' in FIG. 1. The probe 3, as shown in FIG. 1, comes into contact with the bonding pad 2 in the direction H2 parallel to the line A–A' and, as shown in FIG. 2, at an inclination to the bonding pad.

As shown in FIG. 2, a field oxide film 12, an interlayer insulation film 13, a lower-layer metal pad 14, an interlayer insulation film 16, a plurality of connection parts 15 provided in a line within the interlayer insulation film 16, an upper-layer metal pad 17, and a passivation film 18 are formed on a semiconductor substrate 11.

The longitudinal direction H1 of the connection part 15 is established so as to be in the same direction as the direction H2 in which the probe 3 comes into contact with the bonding pad 2.

The upper-layer metal pad 17 and passivation film 18 cover the both ends of the connection part 15.

Referring to FIG. 2, in this embodiment a lower-layer metal pad 14 having a thickness of 0.9 $\mu$m is formed on the interlayer insulation film 13, over which is deposited a 1-$\mu$m-thick interlayer insulation film 16, over which in turn is formed the upper-layer metal pad 17, having a thickness in the range from 0.9 to 1.7 $\mu$m. The lower-layer metal pad 14 and the upper-layer metal pad 17 are connected by a connection part 15 having a width of 0.6 $\mu$m and a spacing of 0.5 $\mu$m, buried by using tungsten CVD. The 5-$\mu$m-thick passivation film 18 on the uppermost layer is opened with an overlap margin of 5 $\mu$m with respect to the upper-layer metal pad 17.

In the present invention having the configuration as described above, in the case in which the probe 3 is lowered as shown in FIG. 2 so as to come into contact with the pad, when the probe 3 comes into contact with the upper-layer metal pad 17, the tip of the probe 3 slides over the surface of the upper-layer metal pad 17 in the direction from A to A', and applies pressure to the upper-layer metal pad 17 downward and in the A' direction. In the present invention, because connection part ends 15a are beneath the passivation film 18, and also because the probe 3 comes into contact with the upper-layer metal pad 17 along the longitudinal direction H1 of the connection part 15, the probe 3 direction H2 is always perpendicular with respect to the boundary between the connection part 15 and the interlayer insulation film 16. Thus, there is no strong force applied to the boundary between the connection part 15 and the interlayer insulation film 16, so that it is difficult for cracks to occur.

The effect of the present invention can be described in further detail referring to FIG. 3, which shows an example of the observed presence or absence of cracks with differing number of times of contacting by a probe. This table shows the amount of overdrive when probing along the vertical direction of the table, and the number of contacts in the horizontal direction. Observations were made with 20 samples of experiment for each structure. Compared with the structure of the past, it can be seen that the present invention exhibits an improvement in immunity to cracking and the ability to perform probing under conditions which do not result in cracks.

Because cracks do not occur during a chip test, therefore, it is difficult for bonding pad peeling to occur during assembly, thereby improving the assembly yield.

Although the above-noted example was one in which the bonding pad is formed in two layers, it is also possible to form a three-layer structure pad, or to form more than three layers pad. In this case, because the connection parts between metal pads except the uppermost connection part is not influenced by probing, the direction of the connection parts except the uppermost connection part need not be made the same as the direction of probing. In this case, instead of using the above-mentioned connection parts except the uppermost connection part, it is possible to connect pads by using a large number of via holes.

Second Embodiment

A second embodiment of the present invention is shown in FIG. 4, in which a lower interconnect 33 is provided beneath a lower-layer metal pad 35 of a bonding pad configured as in the first embodiment.

In this embodiment, because the structure of the bonding pad is the same as in the first embodiment, it also makes it more difficult than the conventional structure for cracks to occur. Therefore, even if a lower interconnect is provided beneath a bonding pad, because there is no loss of migration immunity and open wires, it is possible to maintain reliability of the semiconductor device over a long period of time.

Third Embodiment

Figure 5:
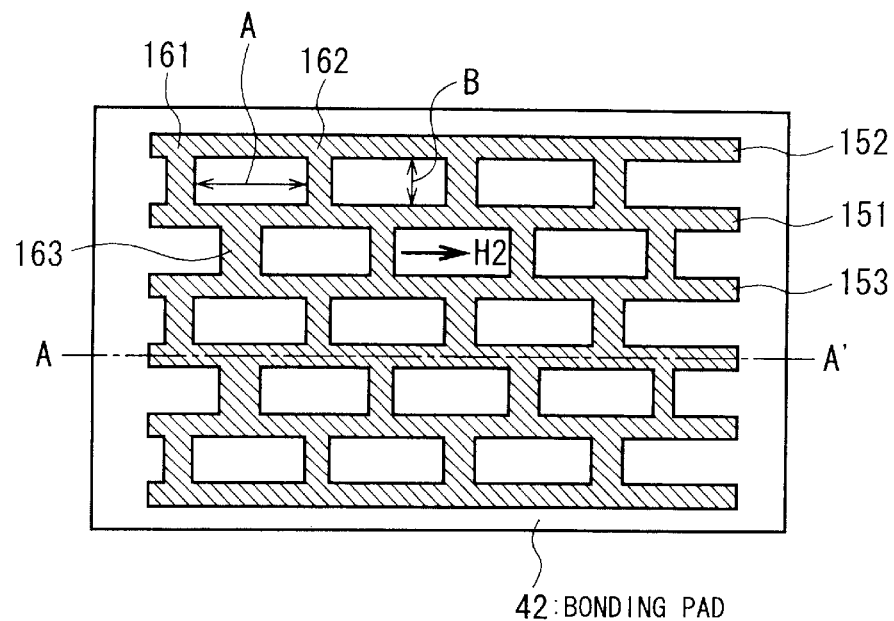
FIG. 5 is a plan view of a third embodiment of the present invention.
Figure 6:
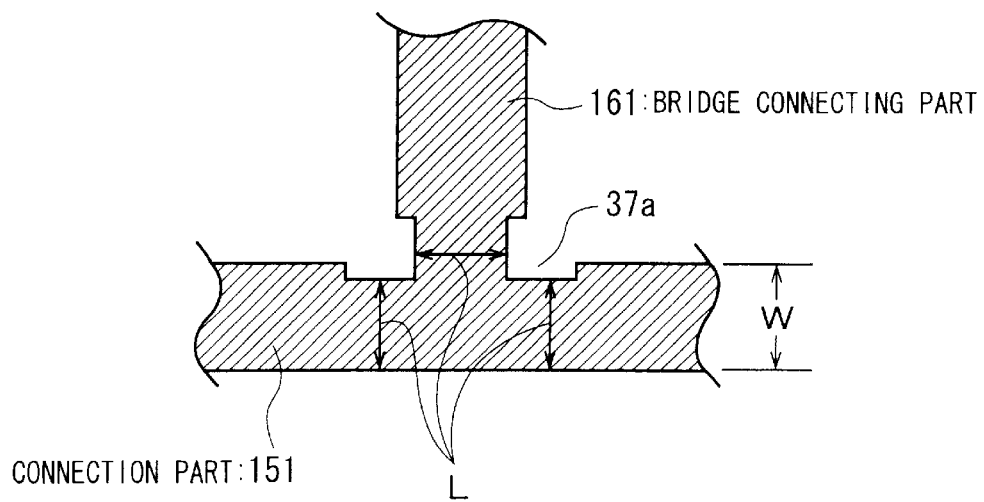
FIG. 6 is an expanded view of the connecting portion in the third embodiment of the present invention.
Figure 7:
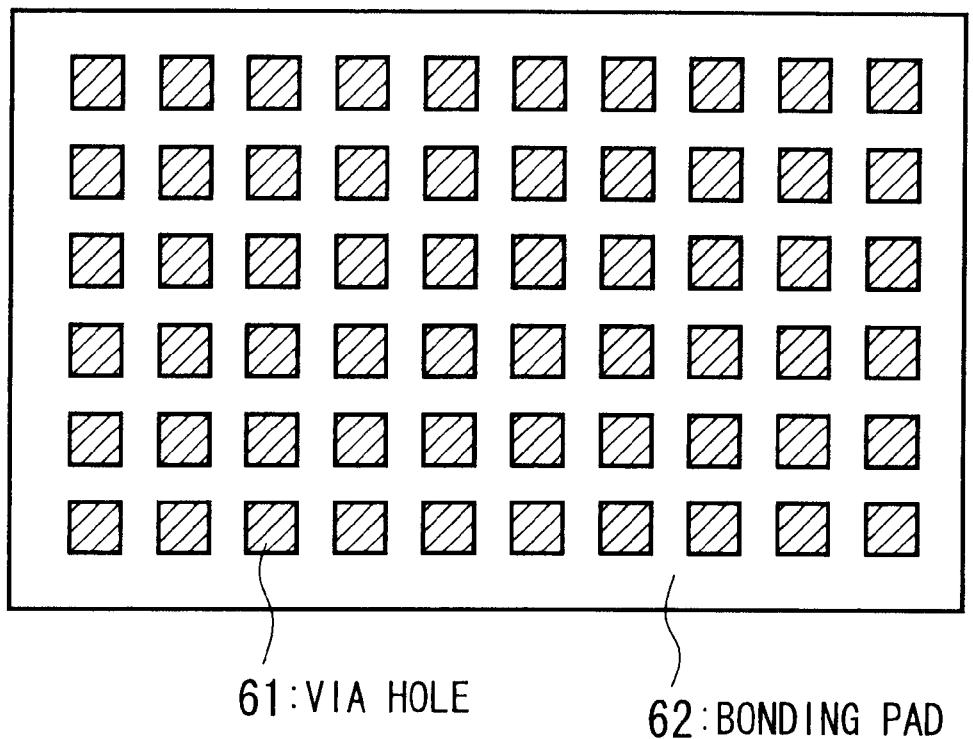
FIG. 7 is a plan view of the prior art.

A third embodiment of a semiconductor device according to the present invention is shown in FIG. 5 and FIG. 6, in which a second connection part 152 and a third connection part 153 are provided so as to sandwich a first connection part 151, the first connection part 151 and the second connection part 152 being connected by a first bridge connecting part 161 and a second bridge connecting part 162, the first connection part 151 and the third connection part 153 being connected by a third bridge connecting part 163 which is disposed between the first bridge connecting part 161 and the second bridge connecting part 162.

As noted above, because the reason it is possible to achieve the effect of making it difficult for cracks to occur is that the direction of force applied at the time of probing is parallel to the boundary between the connection part and the interlayer insulation film, in the third embodiment the lengths B of the bridge connecting parts 161 to 163 provided in a perpendicular direction with respect to the probe contacting direction H2 must be made smaller than the spacing A between the bridge connecting parts, and in this case it is desirable that they be made ½ or smaller.

In this embodiment, the connection parts 151 to 153 are connected by bridge connecting parts 161 to 163 having a width of 0.6 µm, a length B of 1.2 µm and a spacing A of 2.4 µm, buried by using tungsten CVD. The bridge connecting parts 163 is disposed between the bridge connecting part 161 and the bridge connecting part 162. The reason for this is that, because of burying with tungsten CVD, it is difficult to achieve burying when there are corners. Additionally, in order to improve the tungsten burying, as shown in FIG. 6 extending protrusions 37a are provided on the interlayer insulation film 37, (not shown) and it is desirable that the widths of the connection parts and the bridge connecting parts L being made approximately 0.1 µm narrower than the normal slit width W.

By adopting the above-described constitution, a semiconductor device and a test method for manufacturing a semiconductor device according to the present invention prevent cracking of the bonding pads at the time of probing for a chip test, and further make it difficult for pad peeling to occur at the time of bonding.

What is claimed is:

1. A semiconductor device having a bonding pad, said bonding pad comprising:
    a plurality of slit-shaped trenches arranged parallel to each other and formed within an interlayer insulation film provided between a first interconnect layer and a second interconnect layers;
    a first connection part provided within one of said slit-shaped trenches and connecting said first interconnect layer and said second interconnect layer;
    a second connection part and a third connection part provided within other slit-shaped trenches and connecting said first interconnect layer and said second interconnect layer, respectively, said second connection part and said third connection part being disposed so as to sandwich said first connection part with a prescribed spacing;
    a first bridge connecting part and a second bridge connecting part, formed in said interlayer insulation film, connecting said first connection part and said second connection part; and
    a third bridge connecting part, formed in said interlayer insulation film, connecting said first connection part and said third connection part, said third bridge connecting part being disposed between said first bridge connecting part and said second bridge connecting part.

2. A semiconductor device according to claim 1, wherein said first connection part comprises a connection portion with a first width, said first connection part making connection to said first bridge connecting part where said first width is narrower than a width of a non-connection portion of said first connection part.

3. A semiconductor device according to claim 1, wherein a length of said first bridge connecting part making connection to said first connection part and said second connection part is narrower than a spacing between said first bridge connecting part and said second bridge connecting part.

4. The semiconductor device according to claim 3, wherein said length is no greater than 0.5 times said spacing.

5. The semiconductor device according to claim 1, wherein said first connection part is disposed in a longitudinal direction parallel to an insertion direction of a test probe during a chip test.

6. The semiconductor device according to claim 5, wherein said first connection part is oriented in a same direction as said test probe when contacting said bonding pad.

7. The semiconductor device according to claim 1, wherein said second interconnect layer has a thickness in a range from 0.9–1.7 µm.

8. The semiconductor device according to claim 1, wherein an insertion direction of a test probe is perpendicular to a boundary between said first connection part and said interlayer insulation film.

* * * * *